United States Patent [19]
Plough, Jr.
[11] Patent Number: 4,900,417
[45] Date of Patent: Feb. 13, 1990

[54] NICHROME RESISTIVE ELEMENT AND METHOD OF MAKING SAME

[75] Inventor: Charles T. Plough, Jr., Norfolk, Nebr.

[73] Assignee: Dale Electronics, Inc., Columbus, Nebr.

[21] Appl. No.: 185,507

[22] Filed: Apr. 25, 1988

Related U.S. Application Data

[62] Division of Ser. No. 47,112, May 8, 1987.

[51] Int. Cl.[4] .............................................. C23C 14/06
[52] U.S. Cl. .................................. 204/192.21; 29/620
[58] Field of Search .................. 204/192.21; 29/610.1, 29/620

[56] References Cited

U.S. PATENT DOCUMENTS

| | | | |
|---|---|---|---|
| 3,276,865 | 10/1966 | Freche | 420/439 |
| 3,782,928 | 1/1974 | Walter | 148/404 |
| 3,828,296 | 8/1974 | Eiselstein | 338/234 |
| 3,865,581 | 2/1975 | Sekino | 420/43 |
| 4,340,425 | 7/1982 | Barrett | 148/428 |
| 4,498,071 | 2/1985 | Plough, Jr. | 338/308 |
| 4,655,857 | 4/1987 | Masumoto | 148/423 |

FOREIGN PATENT DOCUMENTS

| | | |
|---|---|---|
| 0061322 | 3/1982 | European Pat. Off. . |
| 0093061 | 4/1983 | European Pat. Off. . |

*Primary Examiner*—T. M. Tufariello

[57] ABSTRACT

A resistive element consisting of a metal film, or metal film substitute, comprised of nickel and chromium and which may include aluminum. To this element is added a member of the group consisting essentially of a rare earth element and a transitional element.

15 Claims, No Drawings

NICHROME RESISTIVE ELEMENT AND METHOD OF MAKING SAME

This is a divisional of copending application Ser. No. 47,112 filed on May 8, 1987.

BACKGROUND OF THE INVENTION

A type of resistor in common use involves an insulating substrate core to which has been added a metal film. The core is usually composed of a ceramic or glass substance to which is added a nickel-chromium alloy (nichrome) or nickel-chromium alloyed with one or more other elements which is evaporated or sputtered onto the substrate. A nichrome film is used in resistors because of its stability and near-zero temperature coefficient of resistance (TCR) in the resistors.

It is common to add aluminum to these nichrome films in order to achieve a better TCR. Work with superalloys has indicated that the addition of several percent of aluminum to nichrome superalloys allows a surface oxide to form which consists mainly of $Al_2O_3$. This oxide scale provides greater protection against impurities and corrosion. However, the $Al_2O_3$ oxide spalls at high temperatures. It has further been found that relatively minor additions of rare earth or transitional metals improve the oxidization resistance of the nichrome-aluminum superalloys. Other studies have suggested that common impurities which might invade the film pull electrons away from metal atoms and prevent these electrons from contributing to the stronger metallic-type bonds across grain boundaries.

These studies have not translated easily to work with nichrome films as opposed to superalloys. Research connected with superalloys has not involved electrical resistors. For instance, a patent was issued to NASA in July 1982, involving work to improve superalloys. In that patent, U.S. Pat. No. 4,340,425, zirconium was added to improve the performance of the superalloys with about 0.13% weight optimal and a range of 0.06 to 0.20% weight effective. Work by this inventor discloses that nichrome films require much higher percentages in order to obtain the desired effects, with improvements noted for percentages from about 1.0% to 6.0%, with the optimum around 3.0%. Resistor films also differ considerably from superalloys in their basic makeup. For example, resistor films have a chromium content of 30% or higher, whereas the superalloys usually have a chromium content of 10 to 20%. It is necessary to add 1.0% or more of transitional metals or rare earth elements to obtain results with nichrome film, whereas additions of a fraction of a percent seem optimum for superalloys.

The theory has been developed in the discovery of this invention that addition of the elements listed in this patent improve the resistance of the oxide to corrosion and/or enhance $Al_2O_3$ scale and nickel-chromium-aluminum adherence and stability of the scale. All of the elements are oxygen-active and are also sulfur-active. Elements with a large atomic radius as compared to nickel, which are nearly insoluble with nickel, and which are oxygen-active are also candidates for improving $Al_2O_3$ adherence and stability and, thus, nichrome film stability.

It is the object of this invention to provide a nichrome film or metal film substitute with improved electrical stability on high temperature storage or high power operation or a combination of the two. It is the further objective of this invention to provide greater protection from impurities and inhibit oxide spalling.

DESCRIPTION OF THE INVENTION

This invention describes an improved nichrome film or metal film substitute for use in electrical resistors or with other high temperature use and the method of making the same that results in improved electrical stability. The improved stability results without significantly affecting the TCR of the resistors. These results are achieved by the addition of a transitional element and/or a rare earth element to the film resistor.

The nickel-chromium alloy typically consists of 30% nickel and 70% chromium or 70% nickel and 30% chromium, or some intermediate composition. Aluminum is frequently added to the nickel chromium in amounts sufficient to achieve a TCR of zero. When aluminum is added to the material, a typical composition is 33% nickel, 33% chromium, and 33% aluminum. To the basic nickel-chromium alloy, this invention anticipates addition of a transitional metal and/or a rare earth element. One or a combination of these elements is added in the range of 1.0% to 30% by weight, with the preferred range being 3.0% to 6.0% by weight. Optimum performance is achieved by an addition of 3.0% by weight.

Preferred members of the transitional elements which provide optimal results include scandium, yttrium, zirconium, and hafnium. Members of the rare earth group which provide optimal performance include cerium, praseodymium, neodymium, samarium, europium, gadolinium, terbium, dysprosium, holmium, erbium, thulium, ytterbium, lutetium, and thorium.

It is to be understood that a resistance element may consist of a film deposited upon the substrate or core, or may also consist of a wire wound around the resistor, or where a foil or strip is substituted for the film.

These films are produced by D.C. magnetically-enhanced sputtering in argon. They have been deposited using standard sputtering parameters for nichrome films on ceramic cylinders of the type normally used to produce metal film resistors and on glass or ceramic substrates used to produce thin film networks or chips. The films deposited were typically in the range of 20 to 100 ohms per square. All other processing was identical to that used with standard nichrome films.

Tests were run on examples reflecting the various compositions and the results outlined in the tables that follow. The first test which was conducted was a moisture test in which two different types of resistors were placed into a chamber containing a high percentage of humidity for 10 days. Two types of resistors were tested under this method, one containing film composition of nickel, chromium, and aluminum, the second group of resistors containing a film composition to which zirconium was added. Twenty resistors of each type were tested to determine the average change of resistance in percentage. As the table indicates, improved performance was achieved when zirconium was added.

The second type of test performed on three different types of resistors was a load-life test. In this test, 20 resistors of each of the three types were made to a 1/10 watt size and subjectedto $\frac{1}{8}$ watt power to not exceed 125° C. One type of resistor contained only nickel, chromium, and aluminum; the second contained 1% zirconium; and the third contained 3% zirconium. As the tables indicate, optimal performance was achieved with the addition of zirconium, and the best performance was achieved with a higher amount of zirconium added.

The last test performed was a high temperature exposure test in which the ambient temperature surrounding the resistors was increased to 175° C. In the first group tested nickel, chromium, aluminum, and zirconium made up the film composition, and the resistors were exposed to heat for 250 hours. The resistor containing the higher amount of zirconium showed better performance. In the second group nickel, chromium, aluminum and zirconium were added to the film, with differing amounts of aluminum and zirconium. After exposure to 2017 hours of high temperature, it can be seen that a balance between aluminum and zirconium provided the best performance. Finally, three different types of resistors were exposed to 500 hours of high temperature. Good performance was observed when zirconium was added, better performance was observed when ytterbium was added, and the best performance was achieved when cerium and zirconium were added. These tests demonstrate the improvements shown by this invention.

MOISTURE TESTING (MIL-R-55182)
(Ref. MIL-STD-202, Method 106)

| Approx. Film Composition* | | | | Aver. Change of Resist. in % |
|---|---|---|---|---|
| 34 Ni | 34 Cr | 31 Al | 1 Zr | −.002 |
| 34 Ni | 34 Cr | 33 Al | | +.510 |

LOAD LIFE (125° C., 1/8 WATT)
(1/10 Watt Size)

| Approx. Film Composition* | | | | Aver. Change of Resist. in % |
|---|---|---|---|---|
| 34 Ni | 34 Cr | 31 Al | 1 Zr | .012 |
| 34 Ni | 34 Cr | 29 Al | 3 Zr | .005 |
| 34 Ni | 34 Cr | 32 Al | | .104 |

HIGH TEMPERATURE EXPOSURE (175° C.)

| Approx. Film Composition* | | | | | Time | Aver. Change of Resistance in % |
|---|---|---|---|---|---|---|
| 34 Ni | 34 Cr | 30.5 Al | 1.5 Zr | | 250 | .246 |
| 34 Ni | 34 Cr | 29.0 Al | 3.0 Zr | | 250 | .096 |
| 42 Ni | 42 Cr | 13.0 Al | 3.0 Zr | 2017 | .747 | |
| 42 Ni | 42 Cr | 8.0 Al | 8.0 Zr | 2017 | .947 | |
| 34 Ni | 34 Cr | 27.5 Al | 1.5 Ce | 3 Zr | 500 | .022 |
| 34 Ni | 34 Cr | 29.0 Al | 3.0 Zr | | 500 | .079 |
| 34 Ni | 34 Cr | 29.0 Al | 3.0 Yb | | 500 | .036 |

*All percentages are estimated based on sputtering target configuration.

I claim:

1. The method of making an electrical resistor including an insulating substrate having a supporting surface a resistance element on said supporting surface, said resistance element containing 30% by weight to 70% by weight nickel and 30% by weight to 70% by weight chromium;

adding a substance selected from the group of elements consisting essentially of aluminum, a transitional element, and a rare earth element in a small but effective amount;

whereby said resistance element provides a barrier against impurities, inhibits corrosion and provides electrical stability to said electrical resistor.

2. The method of claim 1, wherein the amount of aluminum is 0.0% to 35% by weight.

3. The method of claim 2, wherein the amount of nickel is 33% by weight, the amount of chromium is 33% by weight, and the amount of aluminum is 33% by weight.

4. The method of claim 1, wherein the transitional element and rare earth element is in the amount of 1.0% to 30% by weight.

5. The method of claim 4, wherein the transitional element and rare earth element is in the amount of 3.0% to 6.0% by weight.

6. The method of claim 5, wherein the transitional element and rare earth element is in the amount of 3.0% by weight.

7. The method of claim 1, wherein the transitional element is selected from the group of metals consisting of scandium, yttrium, zirconium, and hafnium.

8. The method of claim 1, wherein the rare earth metal elements are selected from the group of elements consisting of lanthanum, cerium, praseodymium, neodymium, samarium, europium, gadolinium, terbium, dysprosium, holmium, erbium, thulium, ytterbium, lutetium, and thorium.

9. The method of claim 7, wherein the transitional element zirconium is added in amounts of 1.0% to 6.0% by weight.

10. The method of claim 9, wherein the transitional element zirconium is added in the amount of 3.0% by weight.

11. The method of claim 8, wherein the rare earth element cerium is added in the amounts of 1.0% to 4.0% by weight.

12. The method of claim 11, wherein the rare earth element cerium is added in the amount of 2.0% by weight.

13. The method of claim 1 wherein said substance is added by sputtering on said substrate.

14. The method of claim 1 wherein said substance is a wire wound around said resistor.

15. The method of claim 1 wherein said substance is a foil placed on said substrate.

* * * * *